United States Patent [19]

Cazcarra

[11] 4,220,483
[45] Sep. 2, 1980

[54] METHOD OF INCREASING THE GETTERING EFFECT IN THE BULK OF SEMICONDUCTOR BODIES UTILIZING A PRELIMINARY THERMAL ANNEALING STEP

[75] Inventor: Victor G. Cazcarra, Mennecy, France

[73] Assignee: International Business Machines Corp., Armonk, N.Y.

[21] Appl. No.: 66,593

[22] Filed: Aug. 14, 1979

[30] Foreign Application Priority Data

Sep. 8, 1978 [FR] France .................................. 78 26223

[51] Int. Cl.² ..................... H01L 21/324; H01L 29/04
[52] U.S. Cl. .................................. 148/1.5; 29/576 T; 148/174; 148/175; 156/612; 357/64
[58] Field of Search .................. 148/1.5, 174, 175; 156/612; 29/576 T; 357/64

[56] References Cited

U.S. PATENT DOCUMENTS

| | | | |
|---|---|---|---|
| 3,441,385 | 4/1969 | Schmidt | 148/1.5 X |
| 3,615,873 | 10/1971 | Sluss et al. | 148/1.5 X |
| 3,723,053 | 3/1973 | Myers et al. | 148/1.5 X |
| 3,874,936 | 4/1975 | d'Hervilly et al. | 148/1.5 |
| 3,905,162 | 9/1975 | Lawrence et al. | 148/1.5 X |
| 3,997,368 | 12/1976 | Petroff et al. | 148/175 X |
| 4,053,335 | 10/1977 | Hu et al. | 148/174 |
| 4,144,099 | 3/1979 | Edmonds et al. | 148/1.5 |

OTHER PUBLICATIONS

Biederman, E., "Producing Silicon . . . Getter Density . . . Lattice Defects", IBM Tech. Discl. Bull., vol. 19, No. 4, Sep. 1976, p. 1295.

Hu et al, "Effect of Oxygen on Dislocation Movement in Silicon", J. Applied Physics, vol. 46, No. 5, May 1975, p. 1869.

Maher et al, "Characterization . . . Annealed Silicon Containing Oxygen", J. Applied Physics, vol. 47, No. 9, Sep. 1976, pp. 3813–3825.

Hu et al, "Gettering by Oxygen Precipitation", I.B.M. Tech. Discl. Bull., vol. 19, No. 12, May 1977, p. 4618.

Mets, E. J., "Poisoning and Gettering Effects in Silicon Junctions", J. Electrochem. Soc., Apr. 1965, vol. 112, No. 4, pp. 420–425.

Komaleeva et al., "Influence of Heat Treatment . . . Oxygen in Silicon", Sov. Phys. Semicond., vol. 10, No. 2, Feb. 1976, pp. 191–192.

Cottrell, A. H., "Dislocations and Plastic Flow in Crystals", Textbook, Oxford Univ. Press, 1953.

Barson, F., "Emitter-Collector Shorts in Bipolar Devices", Tech. Digest, 1975, International Electron Dev. Mtg., Dec. 1975, Wash., D. C.

*Primary Examiner*—L. Dewayne Rutledge
*Assistant Examiner*—W. G. Saba
*Attorney, Agent, or Firm*—David M. Bunnell

[57] ABSTRACT

The gettering effect in the bulk of semiconductor bodies is increased by heating the bodies prior to device processing to a temperature of from 750°–900° C. for from 1–8 hours in order to generate oxygen precipitates in the form of clusters.

6 Claims, 7 Drawing Figures

METHOD OF INCREASING THE GETTERING EFFECT IN THE BULK OF SEMICONDUCTOR BODIES UTILIZING A PRELIMINARY THERMAL ANNEALING STEP

DESCRIPTION

FIELD OF THE INVENTION

This invention concerns a method of increasing the gettering effect in the bulk of semiconductor bodies. It, more particularly, concerns the generation of oxygen atom precipitates which will later be utilized as gettering centers of unwanted impurities, during the different thermal cycles which these bodies are usually subject to, in the manufacturing of integrated semiconductor circuits. It also concerns the semiconductor bodies in the form of monocrystalline rods, or wafers, which are obtained through this inventive method.

The techniques relative to the integrated semiconductor circuits and, more specifically, the silicon technology and devices, have been considerably developed these last few years. The purpose is now to obtain the highest ever known integration levels, i.e., to obtain a circuit density ranging about several thousand circuits per square millimeters on a single semiconductor wafer. Serious problems have been encountered not only in the course of the manufacturing steps of the process, such as photoengraving, but also in the material proper as its behavior and properties have not been completely mastered, yet.

That is why the semiconductor material, typically silicon, requires a better knowledge of the physics of the solid state. More particularly, the presence of defects, such as precipitates and impurity migrations, in addition to the crystallographic defects, such as dislocations and stacking faults, has a predominant influence upon the throughputs, performances and reliability of the semiconductor devices. These faults or microfaults are theoretically well-known and the literature dealing therewith, is extensive.

These faults, generally, create pipes in the bulk of the silicon material, which entail short-circuits between the emitter and the collector, unwanted breakdown, soft junctions, non-uniform doping effects as well as alterations in the lifetime of the carriers and in the resistivity of the material. Also, these faults alter some important parameters of the devices, such as gains, leakage currents, saturation voltages, etc., having, in addition, unwanted secondary effects, such as power dissipation and noise generation.

The pipe phenomenon is well-known in the art of semiconductors. For instance, pipes in the NPN type transistors are defined as N type cylinder-shaped regions which extend from the collector region to the emitter region through the P type base region. It has been demonstrated that the crystallographic defects, including the stacking faults and the dislocations, very often play the part of sites wherein the pipes are formed. Enhanced diffusions appear very often in the vicinity of these faults and, more specifically, along the dislocation lines, while entails emitter-collector short-circuits which are detrimental to the performance of the devices. More generally, the dislocations, which consist of a chain of discontinuities, can be considered as the preferential path of the charge migrations over long distances in the bulk of the semiconductor material.

In addition to the short-circuits and the non-uniform doping effect which are caused by the existing dislocations, contaminants are present in the bulk of the material which are also at the origin of important problems. These contaminants can be semiconducting impurity atoms, or metal atoms, such as iron, nickel, copper and gold, which are frequently present in the semiconductor material. They form metal precipitates, or aggregates, very easily in the vicinity of the PN junctions and are very often at the origin of defects. The devices which include such junctions, therefore, have a significant leakage current, are of a low quality and, in the end, will have to be discarded. This phenomenon is known under the term "softness", in the Anglo-Saxon literature. It has been shown that the precipitates require nucleation centers; the dislocations provide for these centers whereas the dopants which precipitate along these dislocations become electrically inactive.

All these aspects are clearly disclosed in the publication by F. Barson, entitled "Emitter Collector Shorts in Bipolar Devices" in Technical Digest 1975 International Electron Devices Meeting, December 1975, Washington, D.C.

The faults and microfaults have long been studied in order to determine the manufacturing processes which would eliminate the same and, which, therefore, would produce devices and crystals with no dislocations. However, authors, such as A. H. Cottrell in his book entitled "Dislocations and Plastic Flow in Crystals" (Oxford University Press 1953), have demonstrated that dislocations present in small quantities in the semiconductor material could promote the production of devices of quality. The study made by A. H. Cottrell is based on the gettering effect of the dislocations, and shows that dislocations can attract punctual faults, such as impurities, which cause them to be surrounded with an atmosphere of unwanted impurities. He considers that the dislocations act as internal traps for these punctual faults and concludes that the dislocations have the property to clean the crystalline bulk free from this type of faults.

That is why, in the large scale integrated circuits, gettering of the impurities is now considered as a necessity.

STATE OF THE ART

The introduction of gettering centers, or nucleation centers, in the semiconductor bodies, such as silicon, is well-known in the art, and is carried out through many various techniques. In a conventional way, faults are introduced through an ion implantation of non-doping impurities, such as argon or silicon, either into the front side of the silicon wafers, such as disclosed in U.S. Pat. Nos. 3,874,936 and 4,069,068, or into the back side.

A top surface of boron or phosphorous doped glass can be utilized to getter these impurities. Another technique consists in forming a polycrystalline silicon layer at the back of the wafer (U.S. Pat. No. 4,053,335).

These gettering centers can also be introduced from a radiation beam, such as a laser, or else, by mechanically damaging the wafer during the lapping step; reference can be made to the U.S. Pat. No. 3,905,162, for instance.

All these techniques have serious drawbacks, more particularly those which are based on a ion-implantation, since as a rule, they require at least one additional time-consuming and expensive implantation step, and, very often, an additional lithographic step.

One is led to wonder if equivalent results could not be obtained through the medium of an internal gettering effect, by generating small clusters which would be used as nucleation sites wherein the impurities would be located during the following thermal cycles.

The concept of internally gettering and unwanted impurities is disclosed in the article by E. Biedermann entitled "Producing Silicon Semi-conductor Wafers with a High Internal Getter Density and a Surface Layer Free from Lattices Defects" published in the IBM Technical Disclosure Bulletin, Vol. 19, No. 4, September 1976, page 1295. In this article, a thermal annealing of the wafer is disclosed, which is carried out at a high temperature and which causes the defects in the wafer to be diffused internally, which makes it possible to obtain a surface layer free from detects wherein the active and/or passive devices will be formed while keeping a useful gettering effect in the center of the wafer. This article, however, is not very precise as to the operating conditions.

S. M. Hu and W. J. Patrick, in an article published in J.A.P. Volume 46, No. 5, May 1975, page 1869 and entitled "Effect of Oxygen on Dislocation Movement in Silicon", disclose the part taken by the oxygen during the propagation of the dislocations as well as the phenomenon relative to the generation of small clusters at temperatures within 700° and 900° C. for oxygen concentrations higher than, or equal to, $1.10^{18}$ atoms/cm$^3$. The silicon wafers obtained from rods grown according to the Czochralski method in a resistance-heated furnance, have, as a rule, an oxygen concentration within 0.5 and $2.10^{18}$ atoms/cm$^3$. However, the thermal processes suggested in this publication for the generation of these clusters are without any interest from an industrial point of view because of their duration: 240 hours at 700° C. or 96 hours at 900° C., on the one hand, and on the other hand, it is mentioned nowhere in the interest that the presence of these small clusters might have as possible gettering centers during the following thermal processes at high temperatures.

D. M. Maher, A. Standinger and J. R. Patel, in an article entitled "Characterization of Structural Defects in Annealed Silicon Containing Oxygen" published in Journal of Applied Physics, Vol. 47, No. 9, September 1976, pages 3813 through 3825, disclose the part taken by the oxygen in the formation of defects, precipitates, dislocations, etc. The study was made from a rod grown according to the Czochralski method and subject to a first annealing step: 700° C. for two hours and then, sliced into wafers. The wafers are subject to a second annealing step at 1000° C. for forty-five hours, and then characterized by means of an electronic transmission microscope in order to determine the nature of the defects present in the wafer. The authors specify that the first annealing step at 700° C. for two hours cause small clusters to be generated which act as nucleation sites necessary to the formation of precipitates which will be advantageously utilized in the second annealing step. This second annealing step, besides, is very important: forty-five hours at 1000° C. It is mentioned nowhere that the nucleation sites are useful for the internal gettering effect during the following thermal cycles, which is precisely the object of the invention. In addition, this first annealing step at 700° C. for two hours, indeed, entails the generation of clusters in small quantities so that the gettering effect is very small, if any at all.

The above-mentioned prior art does not show the necessity to have right from the beginning, a sufficient number of small clusters around which the oxygen atoms will precipitate, in order to ensure the necessary internal gettering effect during the following thermal cycles carried out at high temperatures (within 1000° and 1150° C.). This prior art does not disclose, either, that these clusters are efficiently generated during a single thermal step carried out either at the rod level or at the wafer level, for a range of temperatures within 750° and 900° C. and a length of time from 1 to 8 hours. The implementation of such a thermal cycle at the beginning of the processing of the wafer, presents no difficulty from an industrial point of view.

So, the prior art does not provide for any method of characterizing semiconducting wafers, which would give an accurate indication of the number of the clusters or of the number of the active gettering centers during the thermal steps. This information relative to the precipitability of the oxygen, indeed, is very important from an industrial point of view since it makes it possible to classify the wafers according to their use, be it in the manufacturing of unipolar products (many gettering centers) or in the manufacturing of bipolar products (low number of gettering centers).

In an article published in IBM Technical Disclosure Bulletin, Vol. 19, No. 12, May 1977, page 4618, entitled "Gettering by Oxygen Precipitation", the authors S. M. Hu, J. Patrick and W. A. Westdorp, show the part that the oxygen precipitates can play as impurity gettering centers, and, accordingly, the improvement of the electrical properties of the devices. However, they consider only the initial oxygen level they deem optimum. This study concerns only the diffusion of the oxygen from the surface to the center of the wafer and does not mention that the wafers may contain more or less centers of precipitation. In order to increase the number of the precipitates, they suggest to proceed to an annealing step of 1000° C. for a length of time exceeding four hours. The recommendations they make to both bipolar and unipolar device manufacturers, concern the following point: the initial oxygen level, a point which is important indeed, though incomplete since it is mentioned nowhere how this oxygen behaves.

SUMMARY OF THE INVENTION

In brief, and in reference to the prior art, the part taken by oxygen precipitates to ensure the internal impurity gettering effect is well-known but the formation of these oxygen precipitates requires thermal processes which are carried out at high temperatures and which are time-consuming.

In addition, the prior art gives no information about both the quantity of the oxygen precipitates existing in a silicon material and the behavior of the same during the following thermal cycles carried out at high temperatures.

This invention proposes a method of increasing the internal gettering effect in semiconductor bodies by increasing the number of oxygen atom precipitates through the generation of small clusters which though too small to be detected, act as nucleation sites for these precipitates. This method is characterized in that the semiconductor body is subject to a thermal annealing step at temperatures within 750° and 900° C. and for a length of time between 1 and 8 hours.

This invention proposes also a method of characterizing the precipitation capability of the oxygen atoms in semiconductor bodies, a method which includes the following steps:

measuring the initial concentration ($0_O$) of the oxygen in the body; annealing the body at a temperature T within 950° and 1200° C. for a time length extending between 5 and 100 hours.
cleaning the body in an appropriate solution,
measuring the oxygen concentration (0) and computing the precipitation characteristic $k_T$ according to the relation $$k_T = \frac{-1}{(O_O)t} \cdot \text{Log} \frac{(0)}{(O_O)}$$

Therefore, one object of this invention is to provide for a low temperature method capable of creating small clusters around which the oxygen atoms will precipitate during the following thermal cycles carried out at high temperatures, in order to ensure an internal gettering effect. Another object of this invention is to provide for a method of characterizing semiconductor bodies, which gives advantageously the user the information about the oxygen precipitation phenomenon at different processing temperatures of the wafers, and helps him to choose at best the processing which corresponds to a determined material, in order to obtain optimization of the manufacturing throughputs of the final test.

This invention will be further explained, by way of a non-limitative example, with reference to the accompanying drawings.

DESCRIPTION OF THE PREFERRED EMBODIMENT

The investigations relative to the nature and the level of the impurities in the semiconductor bodies generally involved in micro-electronics, show that the following concentrations given in $10^J$ atoms/cm$^3$ of silicon are obtained from rods grown according to the Czochralski method carried out in a resistance-heated furnace.

TABLE I

| Oxygen | Carbon | Nitrogen | Doping Impurities with a resistivity from 1 to 100 ohms | Metal Impurities |
|---|---|---|---|---|
| 2–20 | 0.3–4 | <0.005 | 0.001–0.13 | <0.005 |

The range of $2-20 \times 10^{17}$ atoms/cm$^3$ of silicon corresponds to an oxygen concentration within 4–40 ppmA; in practice, the silicon wafers utilized present an oxygen concentration within 25 and 35 ppmA, 30 ppmA being a good approximation of the average value. As shown clearly in Table I, the oxygen is the most important impurity in this type of material.

In order to determine the concentration and the evolution of the oxygen precipitates in silicon wafers during different thermal cycles (900°–1200° C.), an experimental study and a characterization method will be disclosed in the following description.

Figure 1:
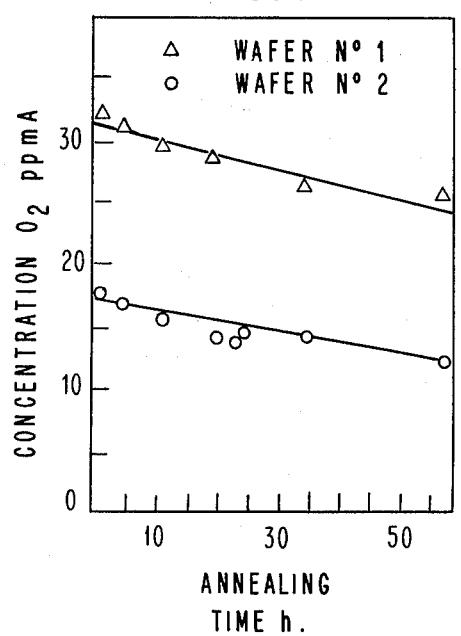
FIG. 1, is a diagram which illustrates the variations in the oxygen concentration for two silicon wafers of a first rod A, with respect to the annealing time at 1050° C.
Figure 2:
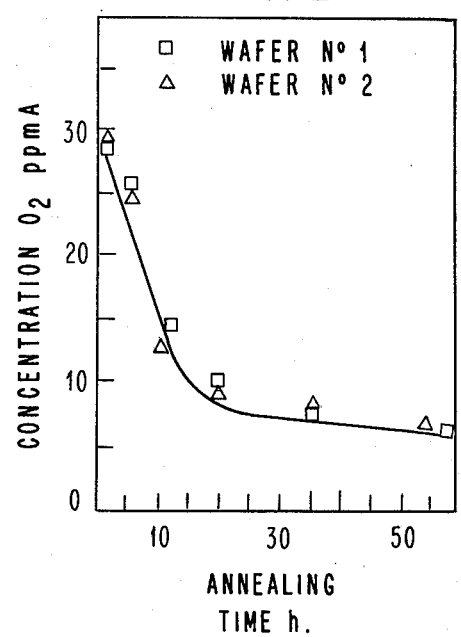
FIG. 2, is a diagram which illustrates the variations in the oxygen concentration for two silicon wafers of a second rod B, with respect to the annealing time at 1050° C.

Silicon wafers being 400 microns thick and prefectly polished on both their sides, and obtained from two different rods A and B, are subject to a thermal annealing step at 1050° C. The oxygen concentration with respect to the annealing time is measured according to the infrared absorption techniques with a Beckmann JB 4240. Indeed, the infrared techniques have many advantages:

They are non-destructive, cheap, easy to use and relatively accurate. The results are shown in FIGS. 1 and 2. The experimentation shows that the oxygen precipitation varies considerably from one crystal to another one, but for different wafers of a same crystal, the behavior, if not identical (FIG. 2), is at least similar (FIG. 1). The curves in FIGS. 1 and 2 show that at a temperature of 1050° C., the clusters behave as gettering centers and accomodate the oxygen atoms which precipitate around them, which explains the very rapid decrease in the oxygen concentration, as clearly shown by the curves.

From those results, one can admit that the kinetics of the precipitation be written as follows:

$$\frac{d(0)}{dt} = -kN_c((0) - (O_f))$$

where (0), is the intersticial oxygen concentration after an annealing step of t hours, (0), is the oxygen solubility limit, $(O_0)$, is the initial oxygen concentration, and $N_c$, is the number of stable clusters.

One admits also that $(O_f)$ is within the 0.5–3 ppmA range, which, therefore, can be neglected when operating with oxygen concentrations higher than 15 ppmA. When admitting that the number of clusters is proportional to the initial oxygen concentration, i.e.:

$$N_c = k_c(O_0)$$

one can write:

$$\frac{d(0)}{dt} = -kk_c(O_0)(0) \text{ and with } k_{1050} = kk_c$$

$$\frac{d(0)}{dt} = -K_{1050}(O_0)(0)$$

-continued $$\frac{d(0)}{(0)} = -K_{1050}(0_0)dt$$

which, upon integration, becomes

Log $(0) = -K_{1050}(0_0)t +$ constant

The limiting condition is $(0)=(0_0)$ at $t=0$; therefrom,

Log$(0) = -K_{1050}(0_0)t +$ Log$(0_0)$ and $$K_{1050} = -\frac{1}{(0_0)t} \text{Log} \frac{(0)}{(0_0)}$$

Should the hypotheses be correct, this coefficient is a characteristic of the oxygen precipitation phenomenon at a temperature of 1050° C.

From a practical point of view, this coefficient can be computed as follows:
 measuring the initial oxygen level $(0_0)$ in the wafer,
 annealing at 1050° C. in a nitrogen atmosphere during $t=20$ hours (the best recommended time from the experimentation to avoid errors),
 cleaning the wafer in a hydrofluoric acid solution, and
 measuring the oxygen level $(0)$
The result will be expressed in ppmA$^{-1}$h$^{-1}$10$^{-3}$.

Figure 3:
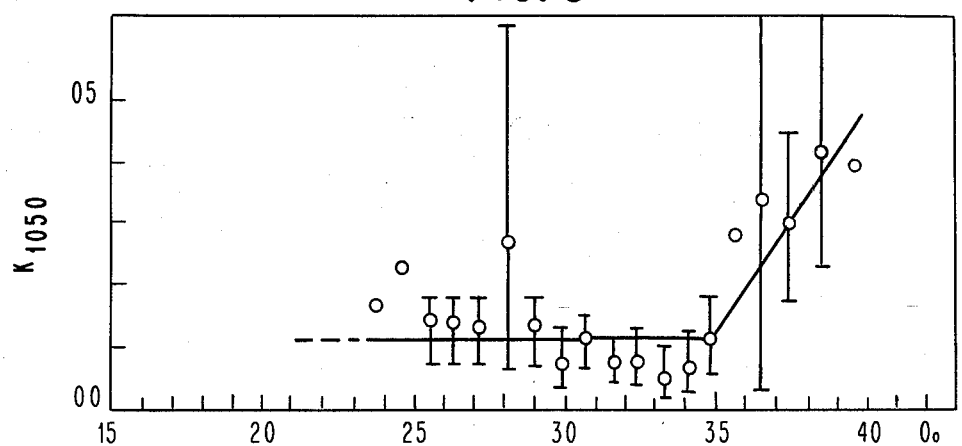
FIG. 3, is a diagram which illustrates the variations in the precipitation coefficient $K_{1050}$ with respect to the initial oxygen concentration.

FIG. 3 illustrates the values of coefficient $K_{1050}$ for wafers having different initial oxygen concentrations $(0_0)$. Coefficient $K_{1050}$ is constant, except for levels higher than $(0_0)=35$ ppmA, values at which coefficient $K_{1050}$ increases very rapidly. The most plausible explanation is that new precipitation centers are generated during the process at 1050° C.

Figure 4:
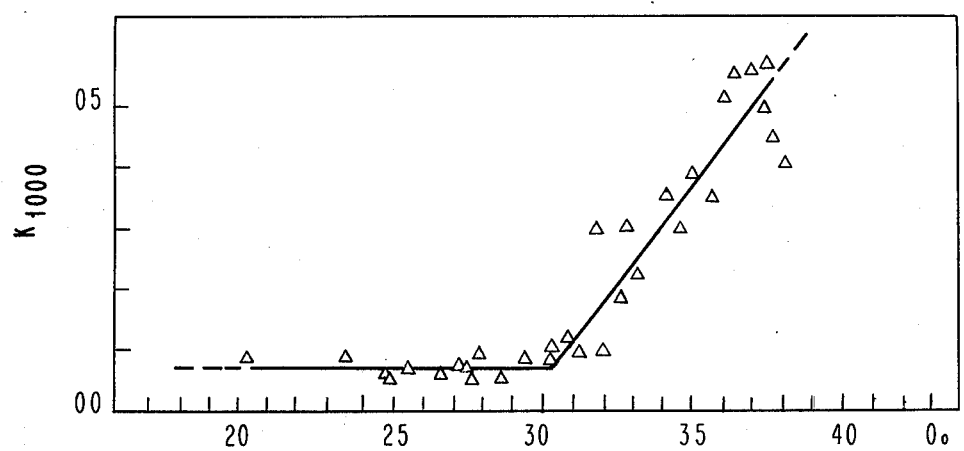
FIG. 4, is a diagram which illustrates the variations in the precipitation coefficient $K_{1000}$ with respect to the initial oxygen concentration.
Figure 5:
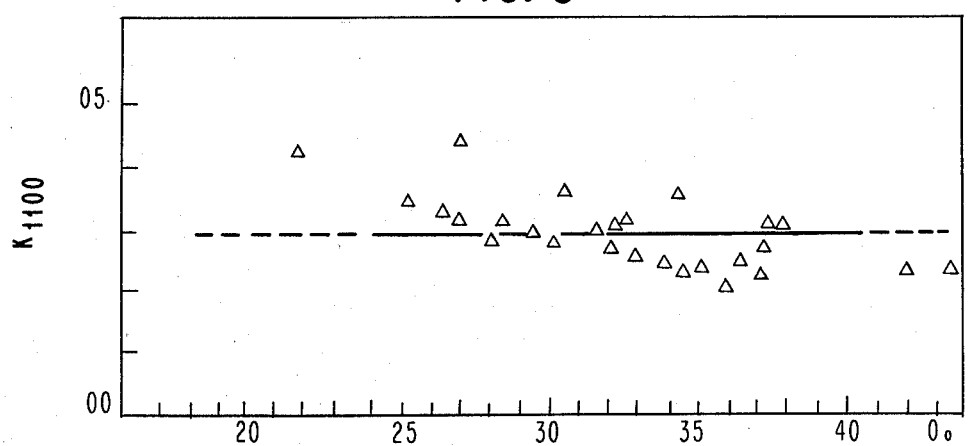
FIG. 5, is a diagram which illustrates the variations in the precipitation coefficient $K_{1100}$ with respect to the initial oxygen concentration.

FIGS. 4 and 5 illustrate coefficients $K_{1000}$ and $K_{1100}$, respectively. An annealing step at 1100° C. removes the phenomenon relative to the generation of precipitation centers; indeed, $K_{1100}$ is approximately constant. All the experimentation shows that the precipitation centers are more easily generated at low temperatures (within a given range) and for higher oxygen levels.

Thus, when considering an initial thermal process at a temperature lower than 1000° C. and, better, lower than 900° C., one may think that many precipitation centers would be created and advantageously utilized in the following thermal processes carried out at high temperatures (diffusion, oxidation, etc.).

Therefore, experimentations have been made to determine the nature of this process (temperatures-time lengths range) for an optimum increase in the precipitation rate.

To this end, thermal processes at 650°–825° C. have been carried out and followed, in any cases, by a thermal process at 1050° C. in order to determine the behavior of the precipitation coefficient $K_{1050}$.

Figure 6:
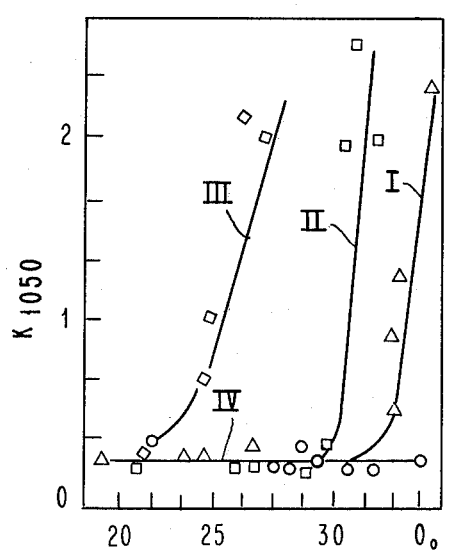
FIG. 6, is a diagram which illustrates the variations in the precipitation coefficient $K_{1050}$ with respect to the initial oxygen concentration after initial annealing processes at 650° C. for different time lengths.
Figure 7:
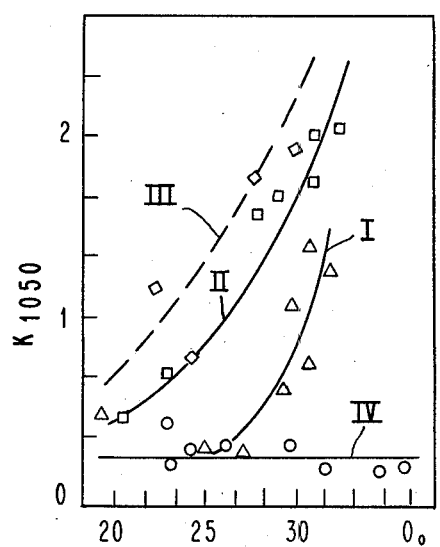
FIG. 7, is a diagram which illustrates the variations in the precipitation coefficient $K_{1050}$ with respect to the initial oxygen concentration after initial annealing processes at 825° C. for different time lengths.

FIG. 6 shows the curves (I, II, III) illustrating the variations in coefficient $K_{1050}$ with respect to $(0_0)$ for a silicon rod subject to a thermal annealing at 650° C. for lengths of time of 8, 16, 32 hours, respectively. FIG. 7 shows the curves (I, II, III) illustrating the variations in coefficient $K_{1050}$ with respect to $(0_0)$ for a silicon rod subject to a thermal annealing at 825° C. for lengths of time 6, 2 and 7 hours, respectively. In both figures, curve IV illustrates the value of coefficient $K_{1050}$ when no thermal annealing is carried out. It can be seen that an annealing step for 2 hours at 825° C. (curve II, FIG. 7) gives coefficient $K_{1050}=2$, i.e., a gain in the order of 7 (see curve IV where $K_{1050}=0.3$) for an initial oxygen concentration $(0_0)=30$ ppmA.

Other experimentations have shown that the precipitation centers are generated in an efficient manner in thermal processes carried out at 750°–900° C. and for a length of time extending between 1 and 8 hours.

From amongst the possible applications of the characterization process disclosed above, one can first mention the characterization of the wafers before their specific future use. The silicon substrates intended to receive bipolar devices, should show a lower number of clusters in order to avoid a high precipitation rate whereas the substrates intended to receive unipolar devices (MOSFET) should show a higher number of clusters. It is, therefore, essential to be able to select those wafers according to their predetermined utilization. In a characteristical silicon rod the following values have been found: $K_{1050}=1.8$ for wafers positioned near the seed, and $K_{1050}=0.35$ for those positioned near the tail of the crystal. The former have been processed successfully on a unipolar device line, owing to the gettering effect ensured by a high oxygen precipitation rate.

On the other hand, in view of the thorough thermal processes carried out on the bipolar devices, the wafers having the higher precipitation rates, have been discarded because of their being warped during the process.

Thus, coefficient $K_{1050}$ appears very useful to provide the wafers with the most convenient process.

When the wafers are to be processed to receive unipolar devices, and when they happen to have too low a precipitation rate as measured by coefficient $K_{1050}$, this rate can be considerably increased by annealing the wafers, anew, according to the process of this invention (from 1 to 8 hours at temperatures within 750°–900° C.) in order to generate new clusters. As seen above, an annealing step of two hours at 825° C. carried out upon a silicon rod improves coefficient $K_{1050}$ from 0.3 to 2.

The experimentation shows that when coefficient $K_{1050} \leq 0.3$, the wafers should be processed to receive bipolar devices whereas when coefficient $K_{1050} \geq 0.5$, the wafers should be processed to receive unipolar devices.

It is clear that the preceding description has only been given as an unrestrictive example and that numerous alternatives can be envisaged without departing from the spirit and scope of this invention.

Having thus described our my invention, what I claim as new, and desire to secure by Letters Patent is:

1. A method of increasing the internal gettering effect in the bulk of silicon semiconductor bodies by generating small clusters which operate as nucleation centers, or precipitation centers, of the oxygen atoms present in the bulk of said bodies, comprising, prior to high temperature thermal cycling, thermally annealing said bodies at temperatures within 750°–900° C. for a length of time of between 1 and 8 hours.

2. The method of claim 1 wherein the length of time is 2 hours.

3. A method according to claim 1 wherein said bodies are rods grown according to the Czochralski method in a resistance-heated furnace.

4. A method according to claim 1 wherein said bodies are wafers sliced from rods grown according to the Czochralski method in a resistance-heated furnace.

5. A method according to claim 2 wherein the thermal annealing step is carried out at 825° C.

6. A method according to claim 1 wherein the thermal annealing step is carried out in a nitrogen atmosphere.

* * * * *